(12) United States Patent
Baburske et al.

(10) Patent No.: US 11,264,459 B2
(45) Date of Patent: Mar. 1, 2022

(54) POWER SEMICONDUCTOR DEVICE

(71) Applicant: Infineon Technologies AG, Neubiberg (DE)

(72) Inventors: Roman Baburske, Otterfing (DE); Moriz Jelinek, Villach (AT); Franz-Josef Niedernostheide, Hagen a. T.W. (DE); Frank Dieter Pfirsch, Munich (DE); Christian Philipp Sandow, Haar (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 16/712,120

(22) Filed: Dec. 12, 2019

(65) Prior Publication Data

US 2020/0194550 A1    Jun. 18, 2020

(30) Foreign Application Priority Data

Dec. 14, 2018 (DE) .......................... 102018132236.4

(51) Int. Cl.
*H01L 29/08* (2006.01)
*H01L 29/06* (2006.01)
(Continued)

(52) U.S. Cl.
CPC .... *H01L 29/0834* (2013.01); *H01L 21/26513* (2013.01); *H01L 21/324* (2013.01);
(Continued)

(58) Field of Classification Search
CPC ............. H01L 29/0834; H01L 29/0638; H01L 29/1095; H01L 29/66333; H01L 21/26513;
(Continued)

(56) References Cited

U.S. PATENT DOCUMENTS

| 2015/0270132 A1* | 9/2015 | Laven ..................... H01L 29/04 257/607 |
| 2016/0141399 A1* | 5/2016 | Jelinek .................... H01L 29/36 257/139 |

(Continued)

FOREIGN PATENT DOCUMENTS

| DE | 112010004241 T5 | 5/2013 |
| DE | 112016000168 T5 | 8/2017 |

*Primary Examiner* — Mohammad M Hoque
(74) *Attorney, Agent, or Firm* — Murphy, Blake & Homiller, PLLC

(57) ABSTRACT

A power semiconductor device includes a semiconductor body having front and back sides. The semiconductor body includes drift, field stop and emitter adjustment regions each of a first conductivity type. The field stop region is arranged between the drift region and the backside and has dopants of the first conductivity type at a higher dopant concentration than the drift region. The emitter adjustment region is arranged between the field stop region and the backside and has dopants of the first conductivity type at a higher dopant concentration than the field stop region. The semiconductor body has a concentration of interstitial oxygen of at least $1E17$ $cm^{-3}$. The field stop region includes a region where the dopant concentration is higher than that in the drift region at least by a factor of three. At least 20% of the dopants of the first conductivity type in the region are oxygen-induced thermal donors.

16 Claims, 11 Drawing Sheets

(51) Int. Cl.
    *H01L 29/10*       (2006.01)
    *H01L 29/66*       (2006.01)
    *H01L 21/265*     (2006.01)
    *H01L 21/324*     (2006.01)
    *H01L 29/739*     (2006.01)

(52) U.S. Cl.
    CPC ...... *H01L 29/0638* (2013.01); *H01L 29/1095* (2013.01); *H01L 29/66333* (2013.01); *H01L 29/7395* (2013.01)

(58) Field of Classification Search
    CPC ............... H01L 21/324; H01L 29/7395; H01L 21/26506; H01L 29/0696; H01L 29/7397; H01L 29/861; H01L 29/0878; H01L 29/36; H01L 29/7802; H01L 29/0619; H01L 29/66712
    USPC ......................................................... 257/143
    See application file for complete search history.

(56) References Cited

U.S. PATENT DOCUMENTS

2016/0322472 A1* 11/2016 Schloegl ........... H01L 29/66712
2017/0317075 A1* 11/2017 Arai ........................ H02P 27/06

* cited by examiner

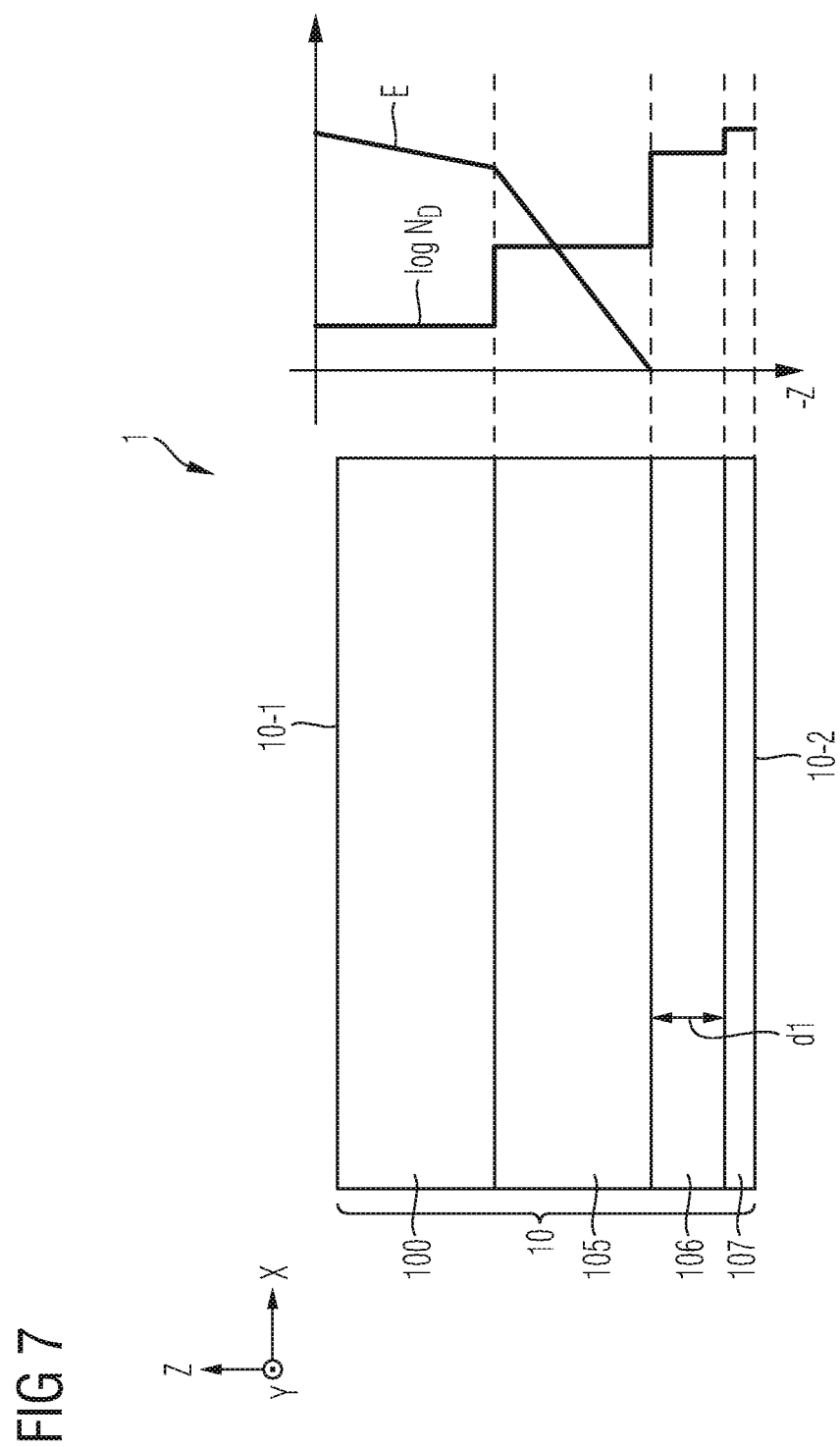

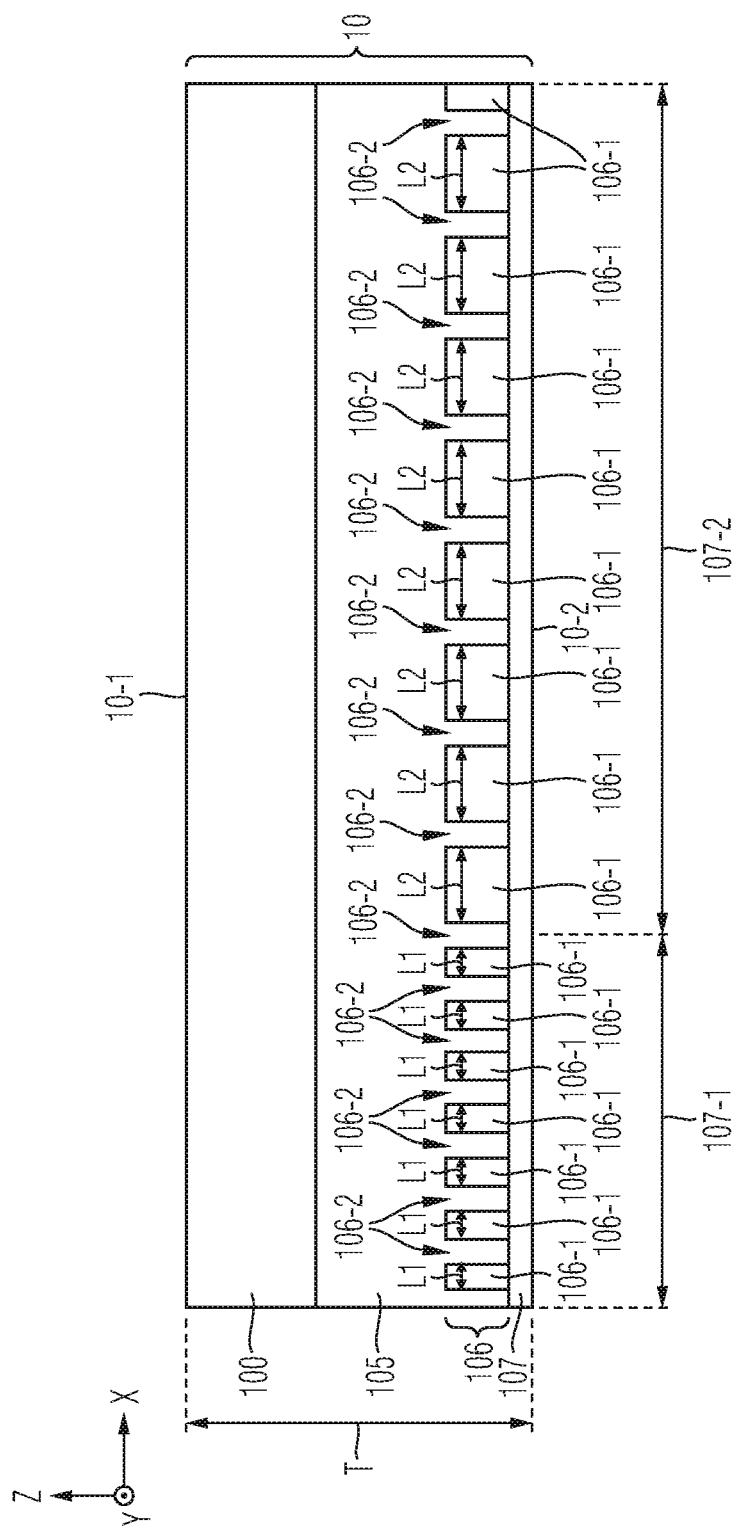

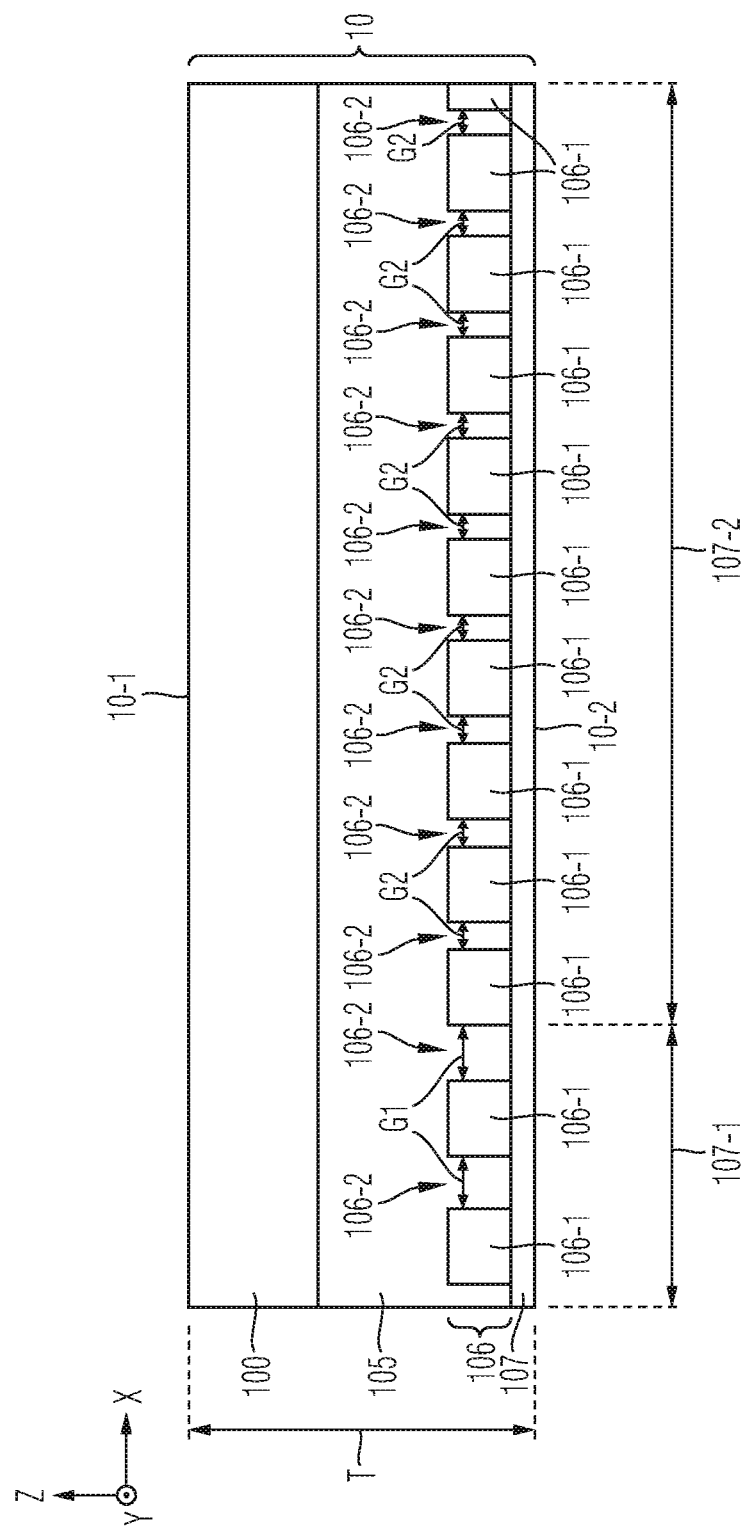

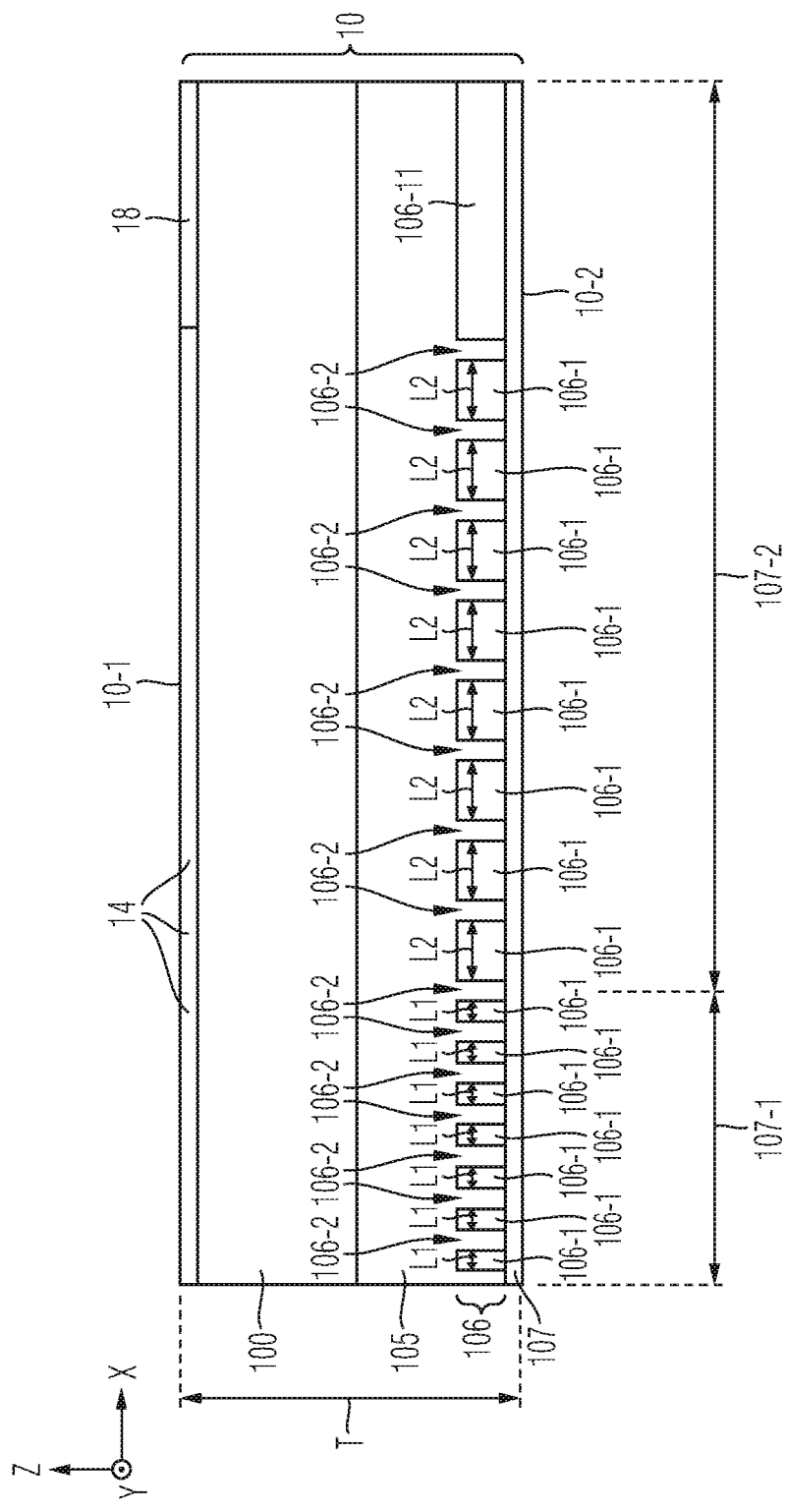

POWER SEMICONDUCTOR DEVICE

TECHNICAL FIELD

This specification refers to embodiments of a power semiconductor device. In particular, this specification relates to embodiments of a power semiconductor device comprising a field stop region, and to embodiments of processing and/or producing such a power semiconductor device.

BACKGROUND

Many functions of modern devices in automotive, consumer and industrial applications, such as converting electrical energy and driving an electric motor or an electric machine, rely on power semiconductor devices. For example, insulated gate bipolar transistors (IGBTs) and metal oxide semiconductor field effect transistors (MOSFETs), to name a few, have been used for various applications including, but not limited to switches in power supplies and power converters, e.g., in traction applications.

A power semiconductor device usually comprises a semiconductor body that is configured for conducting a load current along a load current path between two load terminals of the device. For example, in a vertical arrangement of such a power semiconductor device, a first load terminal may be coupled to a front side of the semiconductor body and a second load terminal may be coupled to a backside of the semiconductor body. The load current path usually traverses a drift region of a first conductivity type (e.g., n-type).

Further, in some cases, the load current path may be controlled by means of an insulated electrode, sometimes referred to as gate electrode. For example, upon receiving a corresponding control signal from, e.g., a driver unit, the control electrode may selectively set the power semiconductor device one of a conducting state and a blocking state.

Often, the semiconductor body includes a field stop region (sometimes also referred to as buffer region) of the first conductivity type, wherein the field stop region may be arranged, for example, between the drift region and the backside. The field stop region may be configured for influencing the course of an electric field during the blocking state of the power semiconductor device. The field stop region may exhibit dopants of the first conductivity type at a higher concentration than the drift region. For example, a drop of the electric field in the blocking state along a direction pointing from the front side to the backside may thus be increased. A field stop region of a semiconductor transistor may come into being, for example, by means of an implantation of protons through the backside of the semiconductor body.

The field stop region may have an influence on a number of further properties of the power semiconductor devices. It is generally desirable to provide power semiconductor devices that are optimized with respect to certain electrical properties, such as conduction and/or switching losses, a short circuit ruggedness, and/or a turn-off softness.

SUMMARY

According to an embodiment, a power semiconductor device comprises a semiconductor body having a front side and a backside, wherein the semiconductor body includes: a drift region of a first conductivity type; a field stop region of the first conductivity type, the field stop region being arranged between the drift region and the backside and having dopants of the first conductivity type at a higher dopant concentration than the drift region, wherein the field stop region has been at least partially created by means of an implantation of protons through the backside; and an emitter adjustment region of the first conductivity type, the emitter adjustment region being arranged between the field stop region and the backside and having dopants of the first conductivity type at a higher dopant concentration than the field stop region; wherein the field stop region comprises, in a cross-section along a vertical direction pointing from the backside to the front side, a dopant concentration profile of dopants of the first conductivity type that exhibits a first local maximum and a first local minimum, the first local minimum being arranged between the first local maximum and another local maximum of the dopant concentration profile of the field stop region and/or between the first local maximum and a maximum of a dopant concentration profile of the emitter adjustment region; and wherein the dopant concentration at the first local maximum is higher than the dopant concentration at the first local minimum at most by a factor of three.

According to a further embodiment, a power semiconductor device comprises a semiconductor body having a front side and a backside, wherein the semiconductor body includes: a drift region of a first conductivity type; a field stop region of the first conductivity type, the field stop region being arranged between the drift region and the backside and having dopants of the first conductivity type at a higher dopant concentration than the drift region, wherein the field stop region has been at least partially created by means of an implantation of protons through the backside; and an emitter adjustment region of the first conductivity type, the emitter adjustment region being arranged between the field stop region and the backside and having dopants of the first conductivity type at a higher dopant concentration than the field stop region; wherein the field stop region comprises, in a cross-section along a vertical direction pointing from the backside to the front side, a dopant concentration profile of dopants of the first conductivity type that exhibits a first local maximum and a first local minimum, the first local minimum being arranged between the first local maximum and another local maximum of the dopant concentration profile of the field stop region and/or between the first local maximum and a maximum of a dopant concentration profile of the emitter adjustment region; wherein the dopant concentration at the first local maximum is higher than the dopant concentration at the first local minimum at most by a factor of three; and wherein the semiconductor body is or comprises a semiconductor substrate having a concentration of interstitial oxygen of at least $1E17\ cm^{-3}$.

According to a further embodiment, a power semiconductor device comprises a semiconductor body having a front side and a backside, wherein the semiconductor body includes: a drift region of a first conductivity type; a field stop region of the first conductivity type, the field stop region being arranged between the drift region and the backside and having dopants of the first conductivity type at a higher dopant concentration than the drift region, wherein the field stop region has been at least partially created by means of an implantation of protons through the backside; and an emitter adjustment region of the first conductivity type, the emitter adjustment region being arranged between the field stop region and the backside and having dopants of the first conductivity type at a higher dopant concentration than the field stop region; wherein the field stop region comprises a region where the dopant concentration is higher than a dopant concentration in the drift region at least by a factor of three, and wherein at least 20% of the dopants of the first conductivity type in said region are oxygen-induced thermal donors.

According to a further embodiment, a power semiconductor device comprises a semiconductor body having a front side and a backside, wherein the semiconductor body includes: a drift region of a first conductivity type; a field stop region of the first conductivity type, the field stop region being arranged between the drift region and the backside and having dopants of the first conductivity type at a higher dopant concentration than the drift region, wherein the field stop region has been at least partially created by means of an implantation of protons through the backside; and an emitter adjustment region of the first conductivity type, the emitter adjustment region being arranged between the field stop region and the backside and having dopants of the first conductivity type at a higher dopant concentration than the field stop region; wherein the semiconductor body is or comprises a semiconductor substrate having a concentration of interstitial oxygen of at least $1E17$ cm$^{-3}$; wherein the field stop region comprises a region where the dopant concentration is higher than a dopant concentration in the drift region at least by a factor of three, and wherein at least 20% of the dopants of the first conductivity type in said region are oxygen-induced thermal donors.

According to a further embodiment, a method of processing a power semiconductor device comprises: providing a semiconductor body having a front side and a backside; creating or providing inside the semiconductor body a drift region of a first conductivity type; creating inside the semiconductor body a field stop region of the first conductivity type by means of at least one implantation of protons through the backside, the field stop region being arranged between the drift region and the backside and having dopants of the first conductivity type at a higher dopant concentration than the drift region; and creating inside the semiconductor body an emitter adjustment region of the first conductivity type, the emitter adjustment region being arranged between the field stop region and the backside and having dopants of the first conductivity type at a higher dopant concentration than the field stop region; wherein the field stop region comprises, in a cross-section along a vertical direction pointing from the backside to the front side, a dopant concentration profile of dopants of the first conductivity type that exhibits a first local maximum and a first local minimum, the first local minimum being arranged between the first local maximum and another local maximum of the dopant concentration profile of the field stop region and/or between the first local maximum and a maximum of a dopant concentration profile of the emitter adjustment region; and wherein the dopant concentration at the first local maximum is higher than the dopant concentration at the first local minimum at most by a factor of three.

According to a further embodiment, a method of processing a power semiconductor device comprises: providing a semiconductor body having a front side and a backside; creating or providing inside the semiconductor body a drift region of a first conductivity type; creating inside the semiconductor body a field stop region of the first conductivity type by means of at least one implantation of protons through the backside, the field stop region being arranged between the drift region and the backside and having dopants of the first conductivity type at a higher dopant concentration than the drift region; and creating inside the semiconductor body an emitter adjustment region of the first conductivity type, the emitter adjustment region being arranged between the field stop region and the backside and having dopants of the first conductivity type at a higher dopant concentration than the field stop region; wherein the field stop region comprises, in a cross-section along a vertical direction pointing from the backside to the front side, a dopant concentration profile of dopants of the first conductivity type that exhibits a first local maximum and a first local minimum, the first local minimum being arranged between the first local maximum and another local maximum of the dopant concentration profile of the field stop region and/or between the first local maximum and a maximum of a dopant concentration profile of the emitter adjustment region; wherein the dopant concentration at the first local maximum is higher than the dopant concentration at the first local minimum at most by a factor of three; and wherein the semiconductor body is or comprises a semiconductor substrate having a concentration of interstitial oxygen of at least $1E17$ cm$^{-3}$.

According to a further embodiment, a method of processing a power semiconductor device comprises: providing a semiconductor body having a front side and a backside; creating or providing inside the semiconductor body a drift region of a first conductivity type; creating inside the semiconductor body a field stop region of the first conductivity type by means of at least one implantation of protons through the backside, the field stop region being arranged between the drift region and the backside and having dopants of the first conductivity type at a higher dopant concentration than the drift region; and creating inside the semiconductor body an emitter adjustment region of the first conductivity type, the emitter adjustment region being arranged between the field stop region and the backside and having dopants of the first conductivity type at a higher dopant concentration than the field stop region; wherein the field stop region comprises a region where the dopant concentration is higher than a dopant concentration in the drift region at least by a factor of three; and wherein at least 20% of the dopants of the first conductivity type in said region are oxygen-induced thermal donors.

According to a further embodiment, a method of processing a power semiconductor device comprises: providing a semiconductor body having a front side and a backside; creating or providing inside the semiconductor body a drift region of a first conductivity type; creating inside the semiconductor body a field stop region of the first conductivity type by means of at least one implantation of protons through the backside, the field stop region being arranged between the drift region and the backside and having dopants of the first conductivity type at a higher dopant concentration than the drift region; and creating inside the semiconductor body an emitter adjustment region of the first conductivity type, the emitter adjustment region being arranged between the field stop region and the backside and having dopants of the first conductivity type at a higher dopant concentration than the field stop region; wherein the semiconductor body is or comprises a semiconductor substrate having a concentration of interstitial oxygen of at least $1E17$ cm$^{-3}$; wherein the field stop region comprises a region where the dopant concentration is higher than a dopant concentration in the drift region at least by a factor of three; and wherein at least 20% of the dopants of the first conductivity type in said region are oxygen-induced thermal donors.

Those skilled in the art will recognize additional features and advantages upon reading the following detailed description and upon viewing the accompanying drawings. It should be noted that features of the invention that have been described above and will be described in the following with regard to a power semiconductor device may analogously apply to processing and/or producing methods, and vice versa. Further, features of different embodiments may be combined with each other to form a further embodiment unless explicitly stated otherwise.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 7 schematically and exemplarily illustrates a section of a vertical cross-section of a power semiconductor device (left panel) and the course of a dopant concentration and a corresponding electric field inside the power semiconductor device (right panel) in accordance with one or more embodiments; and FIG. 8A-8D each schematically and exemplarily illustrates a section of a vertical cross-section of a power semiconductor device in accordance with one or more embodiments.

DETAILED DESCRIPTION

Figure 1:
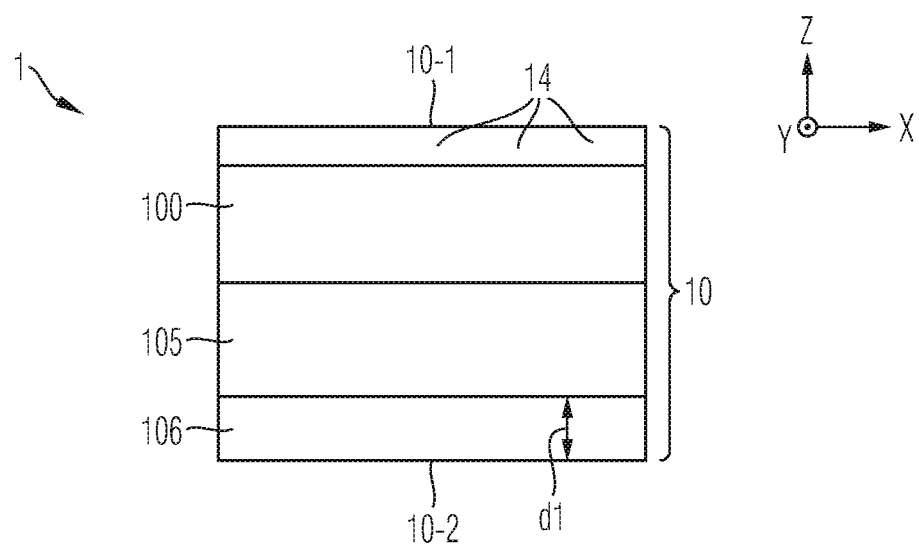
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the vertical direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the terms "charge carrier concentration", "dopant concentration" and "donor concentration" may refer to an average charge carrier/dopant/donor concentration or, respectively, to a mean charge carrier/dopant/donor concentration or to a sheet charge carrier/dopant/donor concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor device that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or monolithically integrated RC-IGBT cell, and/or a monolithically integrated MOS Gated Diode (MGD) cell, and/or a monolithically integrated MOSFET cell and/or derivatives thereof. Such diode cells and/or transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 100 V, more typically 500 V and above, e.g., up to at least 1 kV, or even up to at least 6 kV. For example, the processed semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor-based data processing.

FIG. 1 schematically and exemplarily illustrates a section of a vertical cross-section of a power semiconductor transistor 1 in accordance with one or more embodiments. The illustrated vertical cross-sections extend within a plane defined by a first lateral direction X and a vertical direction Z and is orthogonal to a second lateral direction Y. Each of the illustrated components may also extend along the second lateral direction Y.

The semiconductor device 1 comprises a semiconductor body 10 having a front side 10-1 and a backside 10-2. For example, the semiconductor body 10 may be coupled to each of a first load terminal structure and a second load terminal structure (not illustrated). The first load terminal structure may be, for example, an anode terminal, an emitter terminal, or a source terminal (depending on the type of power semiconductor device) that is, e.g., coupled to the front side 10-1 of the semiconductor body 10. The second load terminal structure may be, for example, a cathode terminal, a collector terminal, or a drain terminal, which may be coupled to the backside 10-2 of the semiconductor body 10. For example, the first load terminal structure and/or the second load terminal may comprise respective front side or backside metallizations.

In an embodiment, the semiconductor body 10 is or comprises a semiconductor substrate having a concentration of interstitial oxygen of at least 1E17 cm$^{-3}$. For example, the semiconductor substrate may have been produced by means of a Czochralski (Cz) or Magnetic Czochralski (MCz) process.

The semiconductor body 10 comprises a drift region 100, which may, for example, be configured for conducting a load current between the first load terminal structure and the second load terminal structure mentioned above. The drift region 100 may comprise dopants of a first conductivity type (e.g., n-type). In an embodiment, the drift region 100 is an n$^-$-doped semiconductor region.

Further, the power semiconductor device 1 may comprise one or more power cells 14 that each extend at least partially into the semiconductor body 10 at the front side 10-1. The one or more power cells 14 may be configured for controlling the load current in dependence on a flow direction of the load current and/or in dependence on a switching state of the power semiconductor device 1. For example, in case the power semiconductor device 1 has a diode configuration, one large power cell 14 may be provided, wherein the power cell 14 may comprise an anode region of the second conductivity type. A transition between the anode region and the drift region 100 may form a pn-junction that is configured for blocking a blocking voltage. In another embodiment, wherein the power semiconductor device has a transistor configuration, a plurality of power cells 14 (not illustrated individually in FIG. 1) may be provided, which may be configured for selectively switching the power semiconductor transistor 1 into one of a conducting state and a blocking state. In other words, the one or more power cells 14 may be configured for selectively conducting a load current or blocking a blocking voltage depending on a switching state of the power semiconductor device 1. For example, in an embodiment, the power semiconductor device 1 is or comprises an IGBT. Correspondingly, a plurality of power cells 14 in the form of IGBT cells, such as IGBT cells having a gate electrode arranged in a vertical trench, may be provided. The skilled person is well acquainted with the principles and variants of configurations of such power cells 14, and they will therefore not be explained in further detail.

The semiconductor body 10 further comprises a field stop region 105 of the first conductivity type, the field stop region 105 being arranged between the drift region 100 and the backside 10-2. It should be noted that, in the present context, the relation "between" is to be understood in a broad sense, i.e., there may be arranged further elements, such as an emitter adjustment region 106 referred to below, between the field stop region 105 and the backside 10-2, see FIG. 1. As is in principle known to those skilled in the art, such a field stop region 105 may be provided for influencing the course of an electric field especially during the blocking state of the power semiconductor device 1.

The field stop region 105 may comprise dopants of the first conductivity type at a higher concentration than the drift region 100. This is further illustrated in each of FIGS. 2A and 2B, which schematically and exemplarily depict dopant concentration profiles extending inside the semiconductor body 10 from the backside 10-2 along the vertical direction Z. For example, a drop of the electric field in the blocking state along a direction pointing from the front side 10-1 to the backside 10-2 (i.e., along a direction opposite to the vertical direction Z) may thus be increased in the field stop region 105 due to the presence of the field stop region 105.

For example, the field stop region 105 may have come into being by means of an implantation of protons through the backside 10-2 of the semiconductor body 10. Such an implantation process may be followed by a subsequent annealing step, which may be carried out, e.g., at temperatures in the range from 380° C. and 420° C. and for a duration in the range form 30 min to 10 hours or between 1 hour and 5 hours. Thus, in the context of the present specification, the term "dopants" may, for example, designate charge centers that have been created inside the semiconductor body 10 by means of proton implantation and subsequent thermal annealing.

In an embodiment, a dose of dopants of the first conductivity type inside the field stop region 105 amounts to at most 50% of a break-through charge that is specific for the material of the semiconductor body 10. For example, said dose may be in the range from 15% to 70% or from ¼ to ½ of the break-through charge that is specific for the material of the semiconductor body 10, e.g., in the range from 2E11 $cm^{-2}$ to 8E11 $cm^{-2}$ or from 2.5E11 $cm^{-2}$ to 5E11 $cm^{-2}$ in the case of a silicon semiconductor body 10.

Figure 2A:
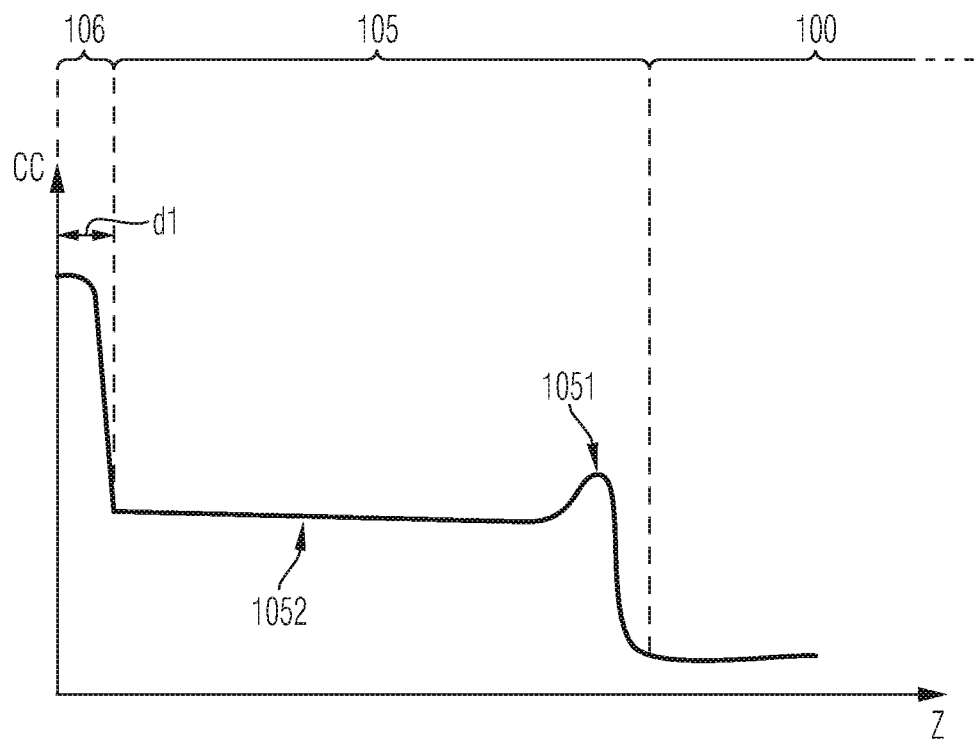
FIGS. 2A-2B each schematically and exemplarily illustrate a dopant concentration profile inside an emitter adjustment region and a field stop region in accordance with one or more embodiments.
Figure 2B:
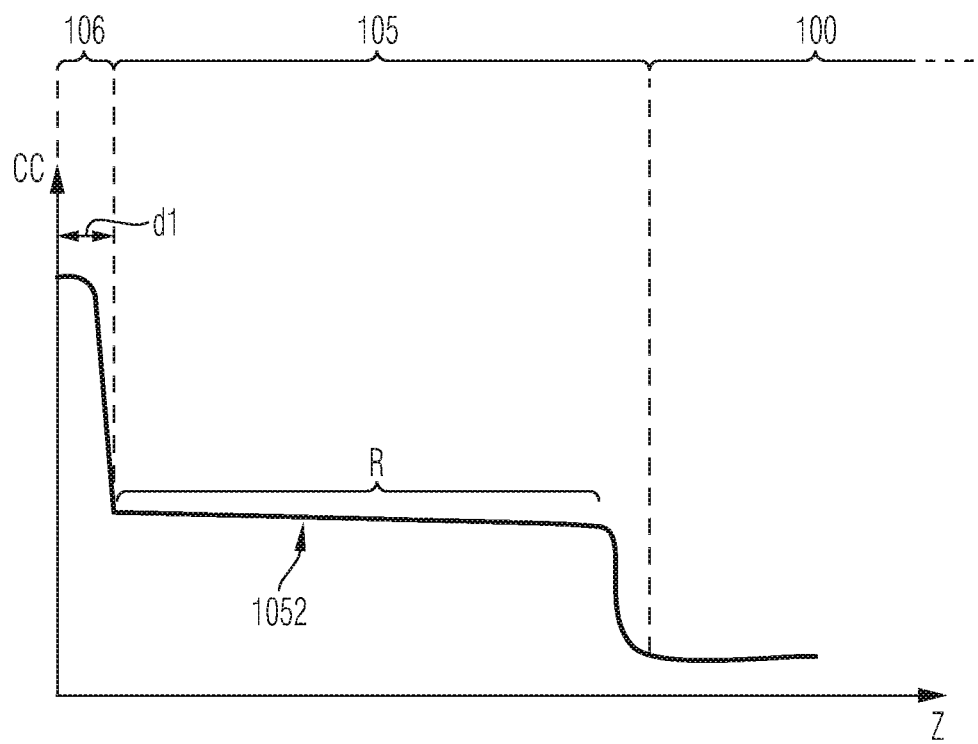

In addition to the field stop region 105, the semiconductor body 1 may comprise an emitter adjustment region 106 of the first conductivity type, as schematically shown in FIG. 1 and as further illustrated in the dopant concentration profiles of FIGS. 2A and 2B. The emitter adjustment region 106 is arranged between the field stop region 105 and the backside 10-2 and has dopants of the first conductivity type at a higher dopant concentration than the field stop region 105. Also in this context, the relation "between" should be understood in a broad sense, i.e., there may be arranged further elements, such as a backside emitter region 107 referred to below, between the emitter adjustment region 106 and the backside 10-2. For example, a vertical extension dl of the emitter adjustment region 106 may be equal to or smaller than 1 μm or even smaller than 0.5 μm.

In an embodiment, the emitter adjustment region 106 comprises predominantly dopants of another species than dopants created by means of proton implantation (possibly followed by thermal annealing). For example, the emitter adjustment region 106 may predominantly comprise phosphorous and/or arsenic and/or antimony and/or selenium and/or sulfur dopants, which may have been implanted through the backside 10-2. In other words, creating the emitter adjustment region 106 may comprise implanting dopants, such as phosphorous and/or arsenic and/or antimony and/or selenium and/or sulfur dopants, through the backside 10-2.

For example, in an embodiment, a dose of dopants of the first conductivity type inside the emitter adjustment region 106 amounts to at least 50% of a break-through charge that is specific for the material of the semiconductor body 10. For example, said dose may be in the range from ½ to 2 of the break-through charge that is specific for the material of the semiconductor body 10, e.g., in the range from 6E11 $cm^{-2}$ to 2.4E12 $cm^{-2}$ in the case of a silicon semiconductor body 10.

Figure 3:
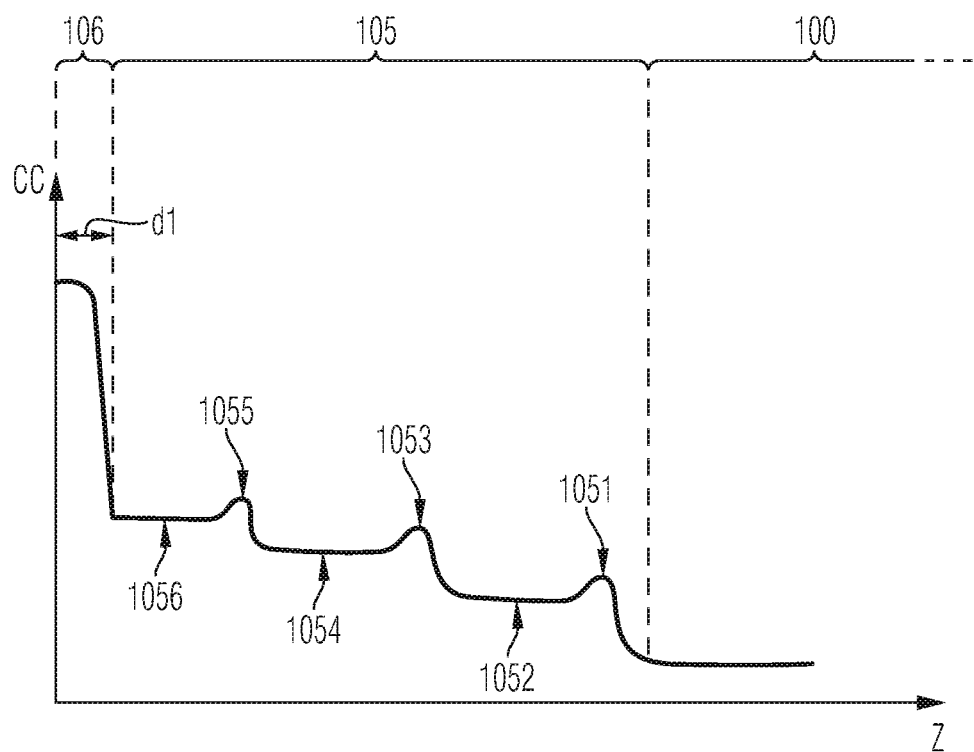
FIG. 3 schematically and exemplarily illustrates a dopant concentration profile inside an emitter adjustment region and a field stop region in accordance with one or more embodiments.

In an embodiment in accordance with each of FIGS. 2A and 3, the field stop region 105 comprises, in a cross-section along the vertical direction Z, a dopant concentration profile of dopants of the first conductivity type that exhibits a first local maximum 1051 and a first local minimum 1052. The first local minimum 1052 may be arranged between the first local maximum 1051 and a maximum of a dopant concentration profile of the emitter adjustment region 106, as illustrated in each of FIGS. 2A and 3.

Also in this context, the relation "between" should be understood in a broad sense, i.e., the statement that the first local minimum 1052 may be arranged between the first local maximum 1051 and a maximum of a dopant concentration profile of the emitter adjustment region 106 generally does not exclude embodiments where, e.g., further local maxima 1053, 1055 and local minima 1054, 1056 are arranged between the first local minimum 1052 and said maximum of the dopant concentration profile of the emitter adjustment region 106. This is exemplarily illustrated in FIG. 3 and explained further below.

However, in some embodiments, the first local minimum 1052 may be arranged directly between the first local maximum 1051 and a maximum of a dopant concentration profile of the emitter adjustment region 106, in the sense that, besides the first local minimum 1052, there are no further local maxima or local minima provided between the first local maximum 1051 and said maximum of a dopant concentration profile of the emitter adjustment region 106. Accordingly, in the exemplary embodiment illustrated in FIG. 2A, the dopant concentration exhibits a single first local maximum 1051 as well as a single first local minimum 1052 that is located between the first local maximum and a maximum of the emitter adjustment region 106. In other words, the dopant concentration profile inside the field stop region 105, exhibits only one deep local maximum, namely the first local maximum 1051. The relatively low doped portion in between said first local maximum 1051 and the emitter adjustment region 106 may comprise thermal donors (i.e., oxygen-induced thermal donors). Thermal donors (oxygen donors) are a class of several species of electrically active oxygen complexes, consisting of small aggregates of a few oxygen atoms. Specifically, thermal donors in silicon are silicon-oxygen complexes containing three or more oxygen atoms as the dominant thermal donor species in heat-treated oxygen-containing silicon. In a further embodiment (not illustrated), the dopant concentration profile inside the field stop region 105 may exhibit, for example, one relatively shallow local maximum (i.e. a local maximum that is located relatively close to the backside 10-2) in addition to one relatively deep local maximum (i.e., a local maximum that may be located e.g., as deep as the first local maximum 1051 in FIG. 2A), wherein the relatively low doped portion in between said relatively shallow local maximum and said relatively deep local maximum may comprise thermal donors.

By contrast, in the exemplary embodiment of FIG. 3, the dopant concentration profile of the field stop region 105 exhibits three local maxima 1051, 1053, 1055 as well as three local minima 1052, 1054, 1056 formed there between and/or between a local maximum 1055 and the maximum of the emitter adjustment region 106. In general, a plurality, e, g. 2 to 5, of such local maxima 1051, 1053, 1055 and corresponding local minima 1052, 1054, 1056 may be provided. Thus, as exemplarily shown in FIG. 3, the first local minimum 1052 may also be arranged between the first local maximum 1051 and another local maximum 1053, 1055 of the dopant concentration profile of the field stop region 105. At the same time, FIG. 3 exemplarily illustrates an embodiment, wherein the first local minimum 1052 is arranged directly between the first local maximum 1051 and another local maximum 1053 in the sense that, besides the first local minimum 1052, there are no further local maxima or local minima provided between the first local maximum 1051 and said other local maximum 1053.

According to an embodiment, the dopant concentration at the first local maximum 1051 is higher than the dopant concentration at the first local minimum 1052 at most by a factor of three, such as, e.g., at most by a factor of two. Further, in a variant embodiment, at least 20%, such as at least 30% or such as at least 50% or even at least 70%, of the dopants at the first local minimum 1052 are thermal donors. In case a plurality of local minima 1052, 1054, 1056 are provided in the field stop region 105, as exemplarily depicted in FIG. 3, also at the further local minima 1054, 1056 at least 20%, such as at least 30% or such as at least 50% or at least 70% of the dopants may be thermal donors.

Further, in an embodiment, wherein a plurality of local maxima are provided in the field stop region 105, the dopant concentration at the local maximum that is located closest to the emitter adjustment region 106 may be smaller than a maximum doping concentration of the emitter adjustment region 106 at least by a factor 3.

In an embodiment in accordance with FIG. 2B, the field stop region 105 does not necessarily comprise a first local maximum 1051 and a first local minimum 1052 as described above. In this embodiment, the field stop region 105 comprises a region R where the dopant concentration is higher than a dopant concentration in the drift region 100 at least by a factor of three, such as at least by a factor of 5 or even 10. Further, at least 20%, such as at least 30% or even at least 40% of the dopants of the first conductivity type in said region R are thermal donors.

Figure 4:
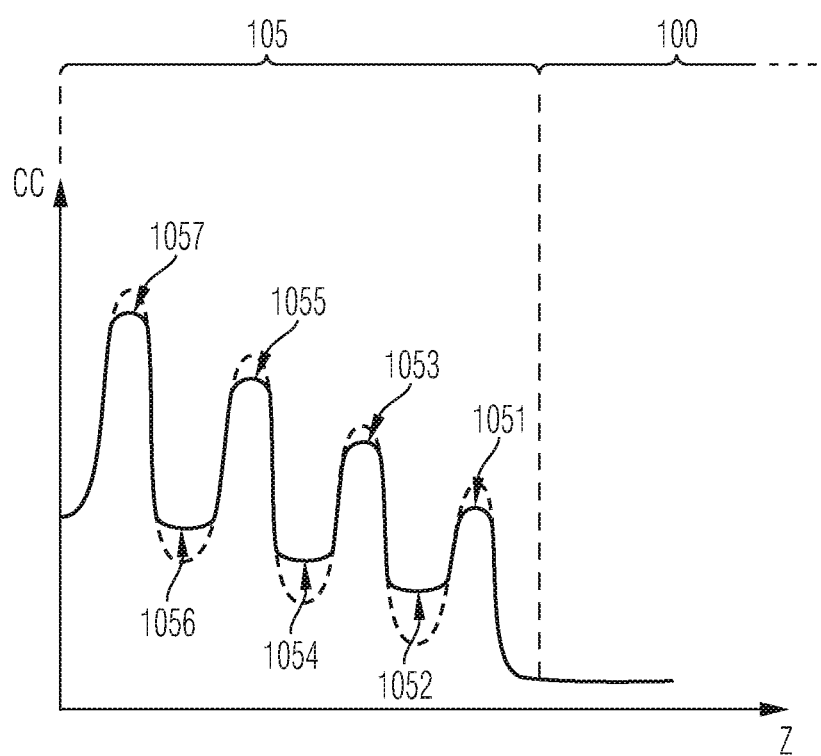
FIG. 4 schematically and exemplarily illustrates a dopant concentration profile inside a field stop region in accordance with one or more embodiments.

In FIG. 4, the solid curve illustrates a further exemplary dopant concentration profile in accordance with one or more embodiments, wherein the field stop region 105 exhibits a plurality of (in this example 4) local maxima 1051, 1053, 1055, 1057 as well as corresponding local minima 1052, 1054, 1056 formed there between. The emitter adjustment region 106 is not depicted in FIG. 4. For example, such a dopant concentration profile may have come into being by means of several proton implantation steps which may be carried out at different implantation energies and/or at different implantation angles with respect to a backside surface. For example, at least three, such as at least 4 different implantation energies may be used. The solid curve in FIG. 4 corresponds to a case wherein the semiconductor body 10 exhibits a relatively high concentration of interstitial oxygen, such as at least $1E17$ $cm^{-3}$. As mentioned before, the semiconductor substrate may have been produced by means of a Czochralski (Cz) or Magnetic Czochralski (MCz) process, which may result in such a concentration of interstitial oxygen.

For comparison, the dashed curve in FIG. 4 shows a dopant concentration profile that has been created by means of proton implantation in a float zone (FZ) substrate, which has a considerably lower concentration of interstitial oxygen. The comparison shows that the local minima 1052, 1054, 1056 of the solid curve are less pronounced than the corresponding local minima of the dashed curve, i.e., the respective minimum dopant concentration is higher in the case of a relatively high concentration of interstitial oxygen in the substrate. Further, in the case of the solid curve, the proton implantation(s) may have been carried out at relatively low doses, thus yielding local maxima 1051, 1053, 1055, 1057 that are lower as compared to the dashed reference curve.

In an embodiment in accordance with each of FIGS. 3 and 4, the dopant concentration at the local maxima 1051, 1053, 1055, 1057 decreases when going from one local maximum 1057, 1055 1053 to another local maximum 1055, 1053, 1051 along the vertical direction Z. In other words, the dopant concentration may decrease each time when going from one local maximum 1057, 1055 1053 to another local maximum 1055, 1053, 1051 that is located further away from the backside 10-2, i.e., deeper inside the semiconductor body as seen from the backside 10-2. Further, as exemplarily illustrated in FIG. 4, it may be provided that a ratio of a dopant concentration of a local maximum 1051, 1053, 1055 to the dopant concentration of a local minimum 1052, 1054, 1056 that is located adjacent to said local maximum 1051, 1053, 1055 and closer to the backside 10-2 than said local maximum 1051, 1053, 1055 decreases when going from one local maximum 1055, 1053 to another local maximum 1053, 1051 along the vertical direction Z.

Figure 5:
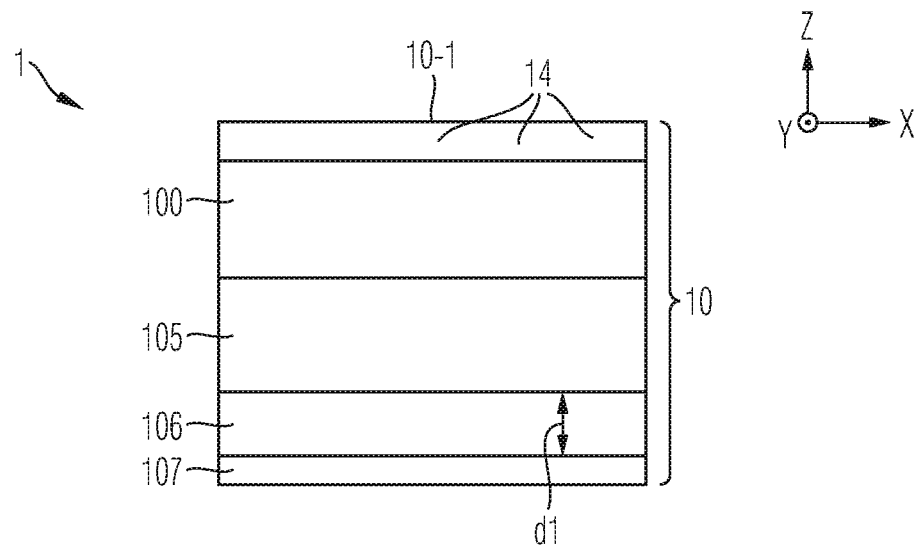
FIG. 5 schematically and exemplarily illustrates a section of a vertical cross-section of a power semiconductor device in accordance with one or more embodiments.
Figure 6A:
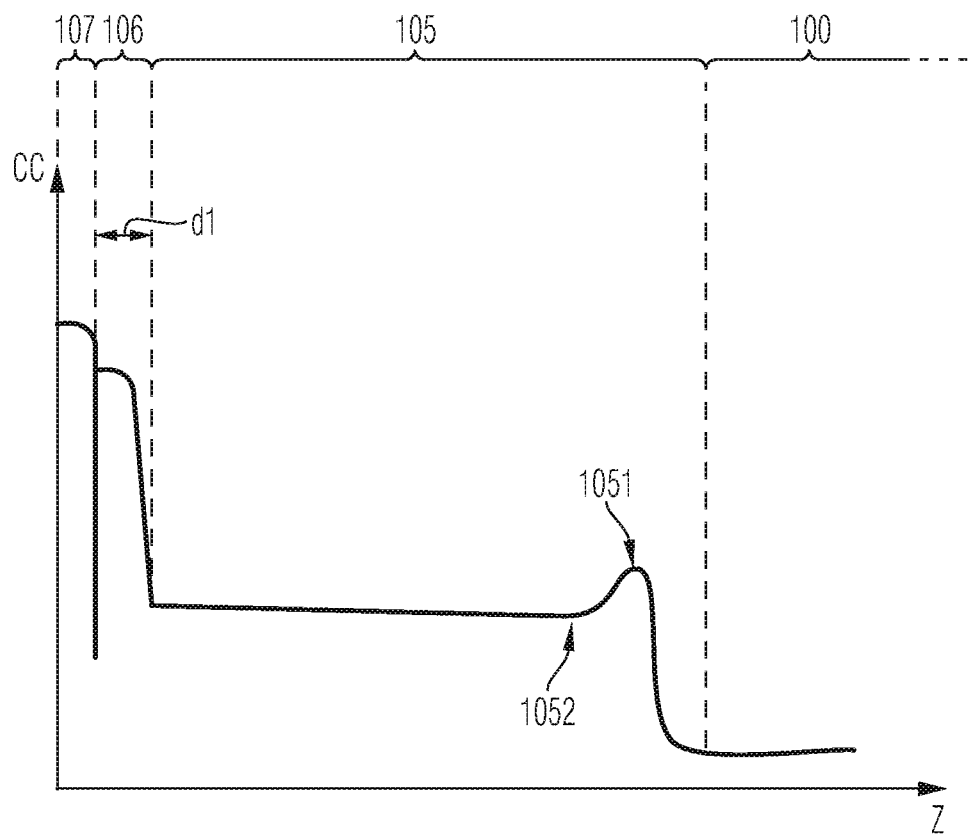
FIG. 6A-6B each schematically and exemplarily illustrate a dopant concentration profile in accordance with one or more embodiments.
Figure 6B:
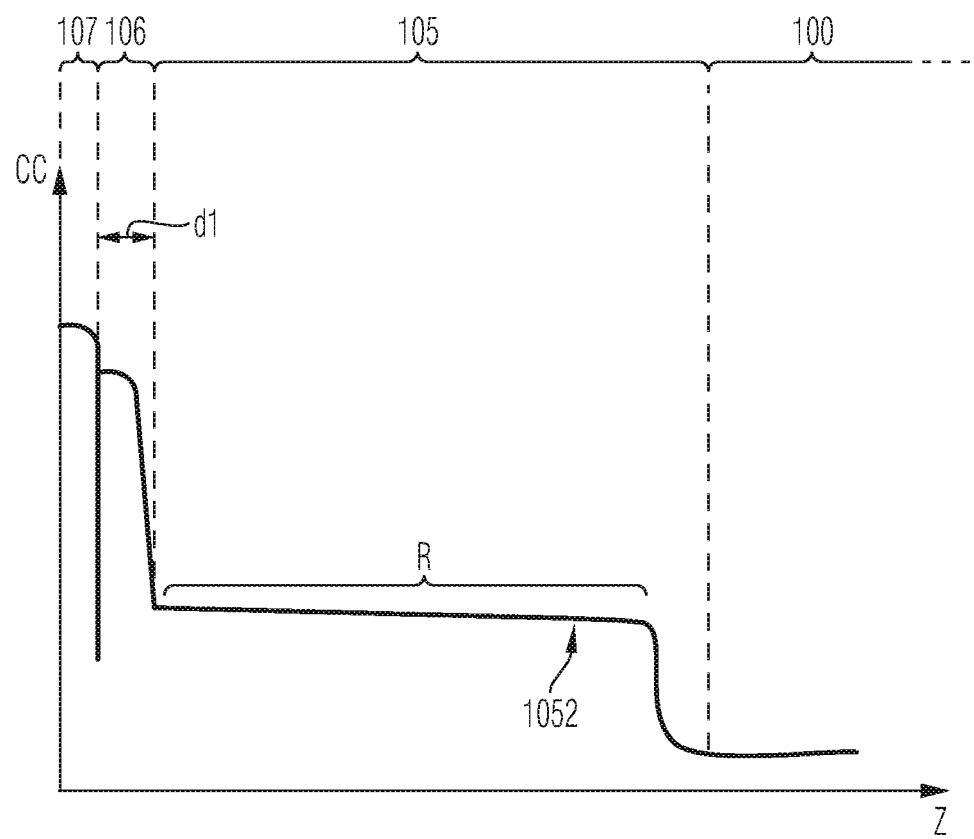
Figure 8A:
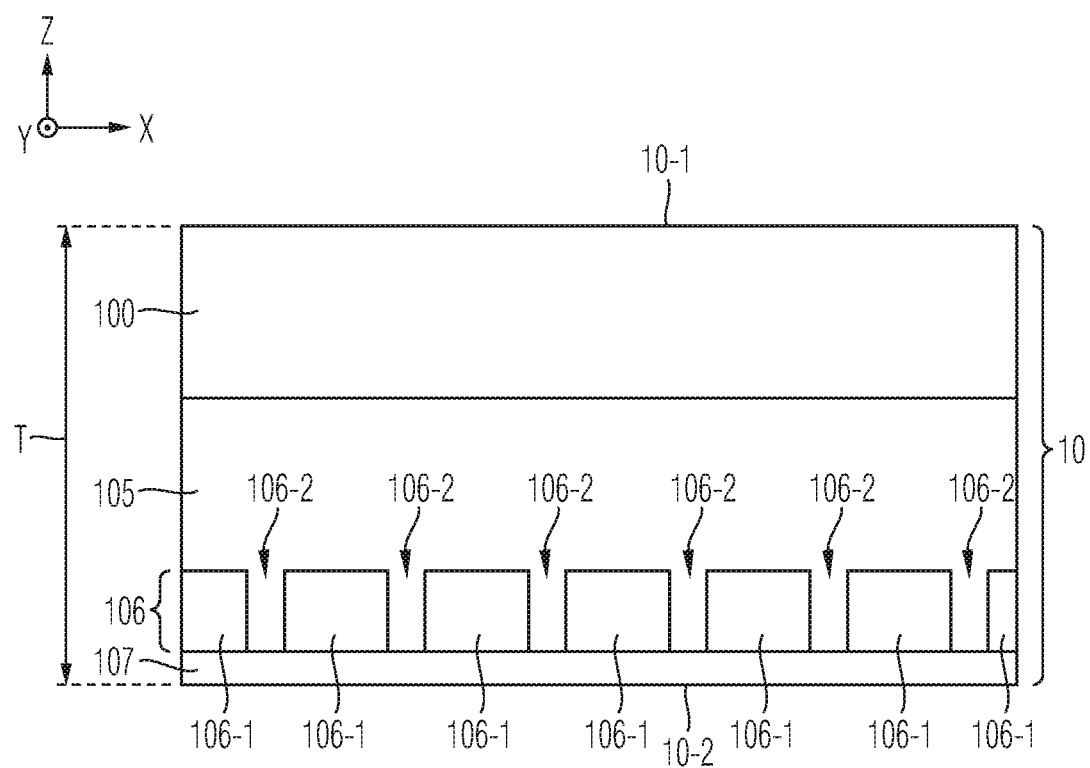

In an embodiment, the semiconductor body 10 may further comprise a backside emitter region 107 of the second conductivity type (e.g., p-type) that may be arranged between the emitter adjustment region 106 and the backside 10-2, as illustrated, e.g., in FIGS. 5, 6A, and 6B. FIGS. 5, 6A, and 6B show in each case a semiconductor device 1 having a backside emitter region 107 and apart from this correspond to the FIGS. 1, 2A, and 2B, respectively, which have been described above. In case the power semiconductor device 1 comprises such a backside emitter region 107, it may, for example, be configured as an IGBT. In another variant, wherein the power semiconductor device 1 is configured, e.g., as a MOSFET or a diode, such a backside emitter region 107 of the second conductivity type may be absent and a highly doped n-type region may be provided instead.

In an embodiment (not illustrated in the Figures), the emitter adjustment region 106 may be arranged at a vertical distance from the backside emitter region 107, wherein, for example, a maximum distance between the region of the backside emitter region 107, which exhibits the maximum doping level, and the region of the emitter adjustment region 106, which exhibits a maximum doping level, may be less than 1 μm or even less than 500 nm. For example, a region with at least 20%, such as at least 30% or even at least 40% thermal donors may be arranged between emitter adjustment region 106 and the backside emitter region 107.

In an embodiment, a concentration of dopants of the second conductivity in the backside emitter region 107 amounts to at least $1E17$ $cm^{-3}$. Further, in an embodiment, a concentration of dopants of the second conductivity in the backside emitter region 107 may amount to at least three times the concentration of dopants of the first conductivity type in the emitter adjustment region 106.

For example, the backside emitter region 107 may have come into being by means of an implantation of dopants of the second conductivity type, such as, e g., boron dopants. In an embodiment, the backside emitter region 107 and the emitter adjustment region 106 are created by subsequent implantation steps without an intermediate thermal annealing step. In other words, for example, a phosphorous implantation for creating the emitter adjustment region 106 may be directly followed by a boron implantation for creating the backside emitter region 107. Afterwards, a suitable annealing step may be performed, e.g., by means of an ultrashort melting laser treatment.

In an embodiment, a backside emitter efficiency of the power semiconductor device 1 may be substantially determined by the emitter adjustment region 106. For example, a backside emitter efficiency at a nominal current of the power semiconductor device 1 may be reduced by at least 10% or even by at least 30% due to the emitter adjustment region. In other words, the emitter efficiency at nominal current may be 10% or even at least 30% lower in presence of the emitter adjustment region 106 as compared to a situation where the emitter adjustment region 106 would be absent.

FIG. 7 schematically and exemplarily illustrates a section of a vertical cross-section of the semiconductor body 10 (left panel). In addition, a course of the dopant concentration ND (in a logarithmic representation log No) and a corresponding course of an electric field E inside the semiconductor body 10 are schematically illustrated in FIG. 7 (right panel). The depicted course of the electric field E may correspond to a blocking state at a nominal blocking voltage of the power semiconductor device 1. In the illustrated embodiment, in the blocking state at the nominal blocking voltage, the absolute value of the electric field E inside the semiconductor body 1 decreases along a direction pointing from the front side 10-2 to the backside 10-1 (i.e., along a direction −Z opposite to the vertical direction Z) and does not reach through to the emitter adjustment region 106. For example, the respective doses in the field stop region 105 and the emitter adjustment region 106 may be adapted such that a space charge region does not reach into the emitter adjustment region 106 during normal operation, but reaches into the emitter adjustment region 106 only in case of a short circuit, i.e., when a high current flows and at the same time a high voltage is applied. In an alternative embodiment (not illustrated), the electric field inside the semiconductor body 1 may reach into the emitter adjustment region 106 even during normal blocking operation. In the latter case, the emitter adjustment region 106 may thus also function as a field stop.

In accordance with some embodiments, the emitter adjustment region 106 may exhibit a lateral variation of the dopant concentration of the first conductivity type, e.g., along the first lateral direction X, as exemplarily and schematically illustrated in each of the FIGS. 8A-D. In other words, the emitter adjustment region 106 may be structured laterally in that it comprises a plurality of emitter adjustment zones 106-1 having a relatively high dopant concentration and several intermediate zones 106-2 being arranged laterally between the emitter adjustment zones 106-1, wherein the intermediate zones 106-2 have a relatively low dopant concentration. For example, the emitter adjustment zones 106-1 may be $n^{++}$-doped semiconductor regions and/or the intermediate zones 106-2 may be n-doped or $n^-$-doped semiconductor regions. For example, such a structured emitter adjustment region 106 may have come into being by additively combining a laterally homogeneous $n^+$-doped layer with a structured $n^+$-doped layer, thus obtaining $n^+$-doped intermediate zones 106-2 and $n^{++}$-doped emitter adjustment zones 106-1. In an embodiment, the relatively high dopant concentration inside the emitter adjustment zones 106-1 may exceed a dopant concentration of the backside emitter region 107.

In combination with the backside emitter region 107, a corresponding lateral variation of a backside emitter efficiency may thus be provided, wherein at least one first emitter efficiency zone 107-1 having (as a whole) a relatively high backside emitter efficiency is arranged laterally adjacent to at least one second zone emitter efficiency zone 107-2 having a relatively low emitter efficiency. For example, the second emitter efficiency zone 107-2 may be located closer to a lateral chip edge of the semiconductor body 10 than the first emitter efficiency zone 107-1. In other words, the first emitter efficiency zone 107-1 may be, for example, located in an active area (comprising one or more power cells 14) of the semiconductor device 1 and the second emitter efficiency zone 107-2 may be located, e.g., at least partially below an edge termination structure 18, as schematically illustrated in FIG. 8D. In the exemplary embodiment of FIG. 8D, the second emitter efficiency zone 107-2 further comprises a broad emitter adjustment zone 106-11 that continuously extends below the edge termination structure 18. For example, the dopant concentration in the broad emitter adjustment zone 106-11 may be equal to or even larger than the dopant concentration of the emitter adjustment zones 106-1. As a consequence, for example, the emitter efficiency below the edge termination structure may be drastically reduced so as to ensure a high dynamic robustness ("HDR") of the power semiconductor device by a reduction of the current flow in this area during turn-off of the device.

In an embodiment, as exemplarily shown in FIG. 8B, smaller emitter adjustment zones 106-1 may be provided in the first zone 107-1 as compared to the second zone 107-2. This is to say that a lateral extension L1 of the emitter adjustment zones 106-1 in the first zone 107-1 may be smaller than a lateral extension of the emitter adjustment zones 106-1 in the second zone 107-2. In addition or alternatively, as exemplarily illustrated in FIG. 8C, a lateral extension G1 of the intermediate zones 106-2, i.e., a lateral gap G1 between the emitter adjustment zones 106-1, may be smaller in the first zone 107-1 than a lateral extension G2 of the intermediate zones 106-2 in the second zone 107-2. By such measures confined regions with a higher emitter efficiency may be realized in the chip which may result in a softer turn-off of the devices and with it in lower overshoot voltages.

In some embodiments in accordance with each of FIGS. 8A-D, a total lateral extension of the one or more first emitter efficiency zone(s) 107-1, which exhibit(s) the relatively high emitter efficiency, may amount to at least 50% of a vertical thickness T of the semiconductor body 10 (i.e., a chip thickness T). For example, said total lateral extension of the one or more first emitter efficiency zone(s) 107-1 may be in the range from 50% to 90% of the vertical thickness T of the semiconductor body 10. Further, in some embodiments, a ratio between total area of the one or more first emitter efficiency zone(s) 107-1 and a total active area of the power semiconductor device 1 may be in the range from 8% to 50%.

Embodiments of a method of processing and/or producing a power semiconductor transistor correspond to the embodiments of the power semiconductor transistor described above with respect to the Figures. Hence, for example, the features of the embodiments of the power semiconductor device described above with reference to the Figures may be achieved by carrying out corresponding processing method steps. Embodiments of a method of processing a power semiconductor device may thus comprise providing a semiconductor body 10 and forming the respective structures being arranged in/on the semiconductor body 10 by processes such as masked or unmasked implantations and/or deposition of semiconductor layers and/or oxide layers.

Features of further embodiments are defined in the dependent claims. The features of further embodiments and the features of the embodiments described above may be combined with each other for forming additional embodiments, as long as said features are not explicitly described as being alternative to each other.

In the above, embodiments pertaining to semiconductor devices were explained. For example, these semiconductor devices are based on silicon (Si). Accordingly, a monocrystalline semiconductor region or layer, e.g., the semiconductor body 10 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 105, 106, and 107, can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising a semiconductor body having a front side and a backside, wherein the semiconductor body comprises:
    a drift region of a first conductivity type;
    a field stop region of the first conductivity type, the field stop region being arranged between the drift region and the backside and having dopants of the first conductivity type at a higher dopant concentration than the drift region, wherein the field stop region was at least partially created by means of an implantation of protons through the backside; and
    an emitter adjustment region of the first conductivity type, the emitter adjustment region being arranged between the field stop region and the backside and having dopants of the first conductivity type at a higher dopant concentration than the field stop region,
    wherein the field stop region comprises, in a cross-section along a vertical direction pointing from the backside to the front side, a dopant concentration profile of dopants of the first conductivity type that has a first local maximum and a first local minimum, the first local minimum being arranged between the first local maximum and another local maximum of the dopant concentration profile of the field stop region and/or between the first local maximum and a maximum of a dopant concentration profile of the emitter adjustment region,
    wherein the dopant concentration at the first local maximum is higher than the dopant concentration at the first local minimum at most by a factor of three,
    wherein the semiconductor body is or comprises a semiconductor substrate having a concentration of interstitial oxygen of at least $1E17$ $cm^{-3}$.

2. The power semiconductor device of claim 1, wherein at least 20% of the dopants at the first local minimum are thermal donors.

3. A power semiconductor device, comprising a semiconductor body having a front side and a backside, wherein the semiconductor body comprises:
    a drift region of a first conductivity type;
    a field stop region of the first conductivity type, the field stop region being arranged between the drift region and the backside and having dopants of the first conductivity type at a higher dopant concentration than the drift region, wherein the field stop region was at least partially created by means of an implantation of protons through the backside; and
    an emitter adjustment region of the first conductivity type, the emitter adjustment region being arranged between the field stop region and the backside and having dopants of the first conductivity type at a higher dopant concentration than the field stop region,
    wherein the semiconductor body is or comprises a semiconductor substrate having a concentration of interstitial oxygen of at least $1E17$ $cm^{-3}$,
    wherein the field stop region comprises a region where the dopant concentration is higher than a dopant concentration in the drift region at least by a factor of three,
    wherein at least 20% of the dopants of the first conductivity type in the region are oxygen-induced thermal donors.

4. The power semiconductor device of claim 3, wherein the emitter adjustment region comprises predominantly dopants of another species than dopants created by means of proton implantation.

5. The power semiconductor device of claim 3, wherein a vertical extension of the emitter adjustment region is equal to or smaller than 1 μm.

6. The power semiconductor device of claim 3, wherein the dopant concentration profile of the field stop region has a plurality of local maxima.

7. The power semiconductor device of claim 6, wherein the dopant concentration at the local maxima decreases when going from one local maximum to another local maximum along the vertical direction.

8. The power semiconductor device of claim 6, wherein a ratio of the dopant concentration of a local maximum to the dopant concentration of a local minimum that is located adjacent to the local maximum and closer to the backside than the local maximum decreases when going from one local maximum to another local maximum along the vertical direction.

9. The power semiconductor device of claim 3, wherein a dose of dopants of the first conductivity type inside the field stop region amounts to at most 50% of a break-through charge that is specific for the material of the semiconductor body.

10. The power semiconductor device of claim 3, wherein a dose of dopants of the first conductivity type inside the emitter adjustment region amounts to at least 50% of a break-through charge that is specific for the material of the semiconductor body.

11. The power semiconductor device of claim 3, wherein the semiconductor body is or comprises a semiconductor substrate that was produced by means of a Czochralski or Magnetic Czochralski process.

12. The power semiconductor device of claim 3, wherein the power semiconductor device is configured for blocking a nominal blocking voltage in a blocking state of the power semiconductor device, wherein in the blocking state at the nominal blocking voltage, an electric field inside the semiconductor body decreases along a direction pointing from the front side to the backside, and wherein the electric field does not reach through to the emitter adjustment region in the blocking state at the nominal blocking voltage.

13. The power semiconductor device of claim 3, wherein the power semiconductor device is configured to block a nominal blocking voltage in a blocking state of the power semiconductor device, wherein in the blocking state at the nominal blocking voltage, an electric field inside the semiconductor body decreases along a direction pointing from the front side to the backside, and wherein the electric field reaches into the emitter adjustment region in the blocking state at the nominal blocking voltage.

14. The power semiconductor device of claim 3, wherein the emitter adjustment region has a lateral variation of the dopant concentration of the first conductivity type.

15. The power semiconductor device of claim 3, wherein the semiconductor body comprises a backside emitter region of a second conductivity type complementary to the first conductivity type, the backside emitter region being arranged between the emitter adjustment region and the backside.

16. The power semiconductor device of claim 15, wherein a concentration of dopants of the second conductivity in the backside emitter region amounts to at least three times the concentration of dopants of the first conductivity type in the emitter adjustment region.

* * * * *